US010978886B2

(12) United States Patent
Yang et al.

(10) Patent No.: US 10,978,886 B2
(45) Date of Patent: Apr. 13, 2021

(54) SELF-INSPECTION TOPOLOGY DESIGN FOR BATTERY ENERGY STORAGE

(71) Applicant: Baidu USA LLC, Sunnyvale, CA (US)

(72) Inventors: Huawei Yang, Sunnyvale, CA (US); Yuan Cao, Sunnyvale, CA (US); Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 4 days.

(21) Appl. No.: 16/514,308

(22) Filed: Jul. 17, 2019

(65) Prior Publication Data

US 2021/0021138 A1   Jan. 21, 2021

(51) Int. Cl.
*H02J 7/00* (2006.01)
*H02J 9/06* (2006.01)
*G06F 1/26* (2006.01)
*H02M 3/158* (2006.01)
*H05K 7/14* (2006.01)

(52) U.S. Cl.
CPC ............ *H02J 7/0021* (2013.01); *G06F 1/263* (2013.01); *H02J 9/061* (2013.01); *H02M 3/158* (2013.01); *H05K 7/1489* (2013.01); *H05K 7/1492* (2013.01)

(58) Field of Classification Search
CPC ......... H02J 7/0021; H02J 9/061; G06F 1/263; H02M 3/158
USPC ...................................... 307/65, 66
See application file for complete search history.

(56) References Cited

U.S. PATENT DOCUMENTS

| 5,969,529 A | * | 10/1999 | Eiraku | ............... | G01R 31/3648 320/136 |
| 2015/0180233 A1 | * | 6/2015 | Yamada | .................. | G06F 1/263 307/23 |

* cited by examiner

*Primary Examiner* — Tomi Skibinski
(74) *Attorney, Agent, or Firm* — Womble Bond Dickinson (US) LLP

(57) ABSTRACT

According to one embodiment, a BBU includes an array of battery cells, a DC/DC converter coupled to the battery cells, and a first switch logic coupled to the battery cells and the DC/DC converter. The first switch logic is configured to switch the BBU to operate between a first mode and a second mode. When operating in the first mode, the first switch logic causes the output voltage of the DC/DC converter to be provided to an external load. When operating in the second mode, the first switch logic causes the output voltage of the DC/DC converter to be coupled to an internal load for the purpose of determining the health of the battery cells.

18 Claims, 4 Drawing Sheets

SELF-INSPECTION TOPOLOGY DESIGN FOR BATTERY ENERGY STORAGE

TECHNICAL FIELD

Embodiments of the present disclosure relate generally to a backup battery unit to provide backup power. More particularly, embodiments of the disclosure relate to a backup battery unit with a self-inspection circuit for determining health of the backup battery unit and other testing purposes.

BACKGROUND

Battery energy storage as one of the energy storage methods is significant important in various applications, such as, electrical vehicles (EVs), consumer electronics, micro grids, solar and wind power, and data center backup units. It provides essential energy to support the applications either as the only source or as a backup when the main power source is not available. Thus, it is extremely important to guarantee its availability and functionality.

In intelligent data centers, a battery backup unit (BBU) in electronic racks is an important device to provide alternative power to the server when the main power supply is out of service. Lithium-ion batteries are the most commonly used battery type for a BBU. However, because the backup time of a BBU is relatively short (e.g., less than few minutes) and the discharging current is very high, the degradation of Li-ion cells will affect the available capacity. As a result, the backup time duration with high current may not be satisfied. In order to guarantee a safe, reliable and high efficient operation condition, the failure detection of the BBU is necessary. There has been a lack of efficient ways to determine the health of battery cells, particularly, in electronic racks of a data center.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
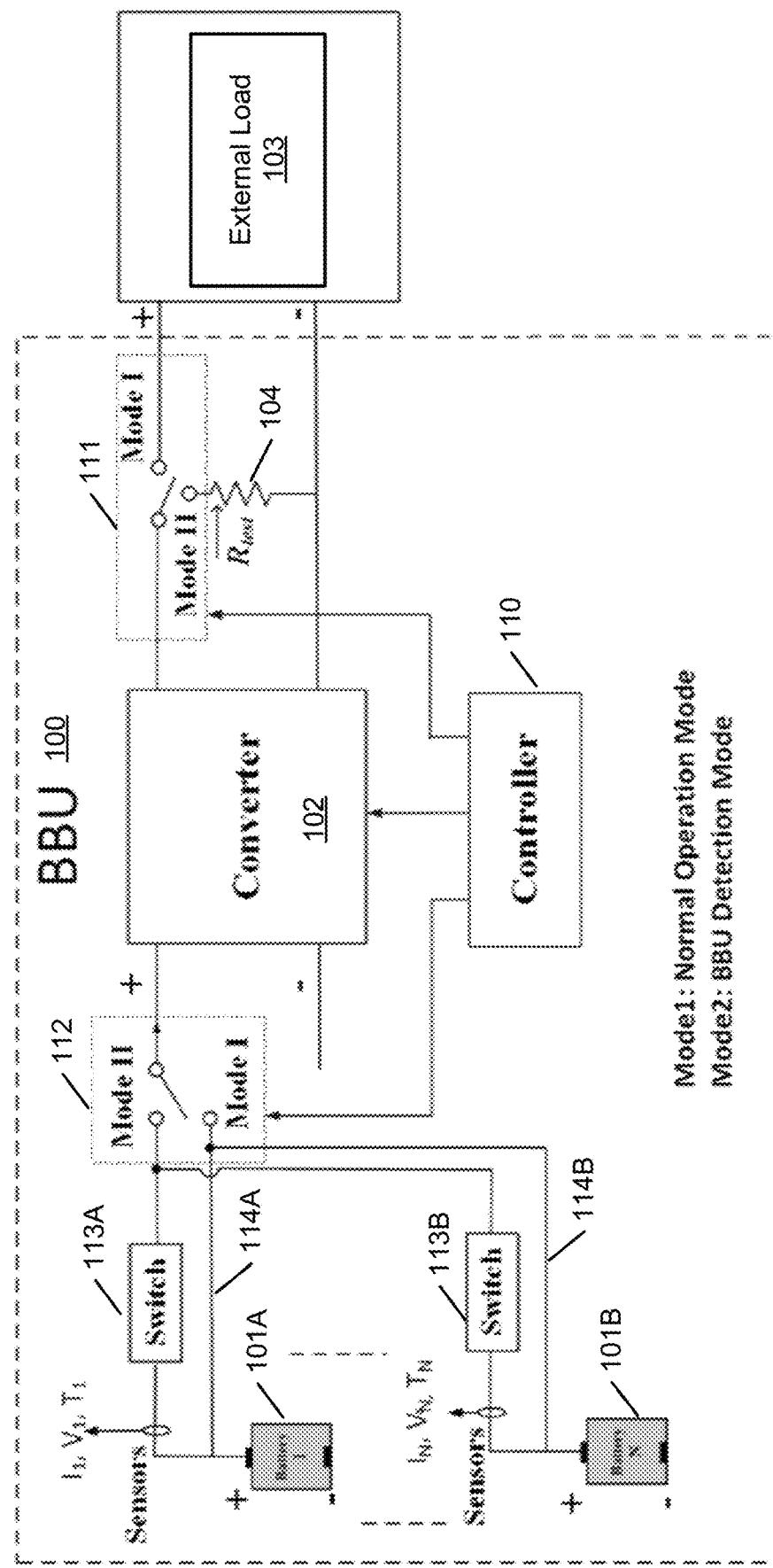
FIG. 1 is a block diagram illustrating an example of a backup battery unit according to one embodiment.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, a topology is proposed with different modes to enable various self-inspection operations, such as temperature rise test, protection test, degradation test, and etc., without interrupting normal operation. A switched-mode control is utilized for a BBU of a data center to perform the main power voltage regulation and battery impedance detection. There are two control modes in the BBU control system. In the first control mode, the main power voltage (also referred to as a busbar voltage) is regulated at the desired reference value by regulating the duty cycle of a direct-current to direct-current (DC/DC) power converter. In the second control mode, the BBU is bypassed from the external load (e.g., the main power) and coupled to an internal load as a test load for the purpose of determining the health of the BBU. At the same time, a perturbation signal at a given frequency is added to the duty cycle of the DC/DC converter to perturb voltage and current of the battery cells in the BBU.

By detecting the magnitude and phase of battery voltage and current, the internal impedance can be detected at the real-time to evaluate the health of the BBU. With the switched-mode control, only one DC/DC power converter is required to perform the main voltage regulation and impedance detection, which reduces the volume, cost and size of the BBU. The operating modes of BBUs enable standalone inspection without interfering the normal operations while increasing the reliability. It does not require physically removing the BBU form an electronic rack in order to perform the inspection. It only requires a very small amount of energy for the inspection, which may not require the battery cells to be recharged after the testing.

According to one aspect, a BBU includes an array of battery cells, a DC/DC converter coupled to the battery cells, and a first switch logic coupled to the battery cells and the DC/DC converter. The first switch logic is configured to switch the BBU to operate between a first mode and a second mode. When operating in the first mode, the first switch logic causes the output voltage of the DC/DC converter to be provided to an external load. When operating in the second mode, the first switch logic causes the output voltage of the DC/DC converter to be coupled to an internal load for the purpose of determining the health of the battery cells.

In one embodiment, the battery cells are coupled in parallel when they are coupled to the DC/DC converter. In one embodiment, the BBU further includes a second switch logic coupled between the battery cells and the DC/DC converter to switch the battery cells to operate between the first mode and the second mode. In one embodiment, the BBU further includes an array of switching devices, one for each of the battery cells to couple a corresponding battery cell to the DC/DC converter respectively. When operating in the first mode, the second switch logic is configured to directly couple the battery cells to the DC/DC converter. When operating in the second mode, the second switch logic is configured to couple the battery cells to the DC/DC converter via their respective switching devices. In one embodiment, at least one of the switching devices is a unidirectional switching device such as a diode, which only allows a current flowing from a battery cell to the DC/DC converter. In one embodiment, a diode is coupled between a positive terminal of a battery cell and a positive terminal of the DC/DC converter.

According to another aspect, an electronic rack includes an array of server blades, each including a computer server for data processing. The electronic rack further includes a power supply to provide power to the server blades and a BBU to provide backup power to the server blades when the power supply is unavailable. The BBU includes components that can operate in a first mode and a second mode as described above.

FIG. 1 is a schematic diagram illustrating an example of a BBU according to one embodiment. Referring to FIG. 1, BBU 100 may be a BBU inserted into an electronic rack of a data center. In one embodiment, BBU 100 includes an array of one or more battery cells 101A-101B (collectively referred to as battery cells 101). Although there are only two battery cells, more or fewer numbers of battery cells may be applicable.

BBU 100 further includes a DC/DC converter 102 coupled to the battery cells 101 and a first switch logic 111 coupled to the battery cells 101 and the DC/DC converter 102. The first switch logic 111 is configured to switch BBU 100 to operate between a first mode and a second mode. When operating in the first mode, the first switch logic 101 causes the output voltage of the DC/DC converter 102 to be provided to an external load 103. That is, when operating in a first mode, switch logic 111 is switched to a first position to cause the output of converter 102 to be coupled to external load 103. External load 103 may represent a computer server or electronic device that draws current or power from converter 102 (e.g., discharging of battery cells). Alternatively, external load 103 may represent an external power supply (e.g., a rack power supply of an electronic rack) that is configured to charge battery cells 101.

When operating in the second mode, the first switch logic 111 causes the output voltage of the DC/DC converter 102 to be coupled to an internal load 104 for the purpose of determining the health of the battery cells 101. That is, when operating in the second mode, switch logic 111 is switched to a second position to cause the output of DC/DC converter 102 to be coupled to internal load 104, which in this example a resister with a predetermined resistance value. When switch logic 111 is switched to the second position in the second mode, external load 103 is decoupled from DC/DC converter 102. Similarly, when switch logic 111 is switched to the first position in the first mode, internal load 104 is decoupled from DC/DC converter 102.

In one embodiment, the battery cells 101 are coupled in parallel when they are coupled to the DC/DC converter 102. In one embodiment, BBU 100 further includes a second switch logic 112 coupled between the battery cells 101 and the DC/DC converter 102 to switch the battery cells 101 to operate between the first mode and the second mode. In one embodiment, BBU 100 further includes an array of switching devices 113A-113B (collectively referred to as switching devices 113), one for each of the battery cells 101 to couple a corresponding battery cell to the DC/DC converter 102 respectively.

Figure 2:
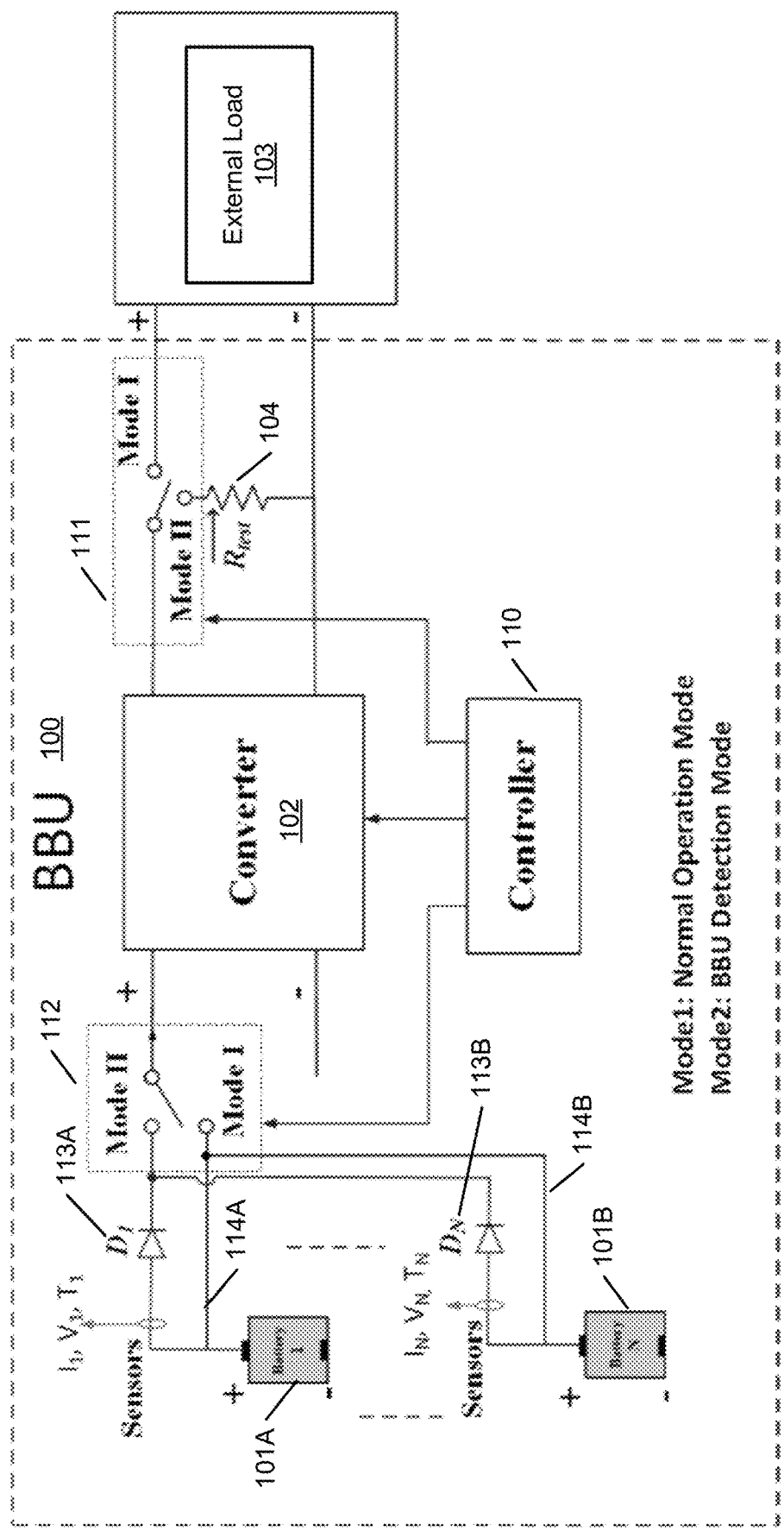
FIG. 2 is a block diagram illustrating an example of a backup battery unit according to another embodiment.

When operating in the first mode, the second switch logic is switched to a first position to directly couple the battery cells 101 to the DC/DC converter 102 via connections 114A-114B (collectively referred to as connections 114). When operating in the second mode, the second switch logic is switched to a second position to couple the battery cells 101 to the DC/DC converter 102 via their respective switching devices 113A-113B. In one embodiment, at least one of the switching devices 113A-113B is a unidirectional switching device such as a diode as shown in FIG. 2, which only allows a current flowing from a battery cell to the DC/DC converter 102. In one embodiment, a diode is coupled between a positive terminal of a battery cell and a positive terminal of the DC/DC converter 102.

Referring to FIG. 2, in this example, the anode terminal of a diode is coupled to a terminal of a battery cell and the cathode terminal of the diode is coupled to a terminal of DC/DC converter 102. Such a connection allows an electrical current flowing in a single direction from the battery cell towards DC/DC converter 102. As a result, during the second mode, an electronic current is prevented from flowing backwardly from DC/DC converter 102 into the battery cell. Similarly, the current is prevented from flowing backwardly from one battery cell to another battery cell. In other words, one battery cell cannot charge another battery cell.

Referring back to FIG. 1, in one embodiment, controller 110 is configured to generate control signals to switch logic 111-112 to control switch logic 111-112 to cause the BBU 100 to operate between the first mode and the second mode. That is, controller 110 generates proper commands or signals to cause switch logic 111-112 to switch between the first position and the second position, which in turn causes BBU 110 to switch between the first mode and second mode. For example, switch logic 111-112 may be configured by controller 110 to synchronously switch between the first position and the second position, such that BBU 110 is to operate between the first mode and the second mode. Controller 110 may generate commands or signals in response to a user input. Alternatively, controller 110 may operate automatically based on a predetermined schedule, such as a self-inspection or testing schedule, to periodically configure BBU 110 to operate in the second mode, such that an internal test or health determination can be performed.

In one embodiment, when BBU 100 is configured in the second mode, an SOH (state of health) or the health of battery cells is determined based on one or more parameters of the battery cells measured during the second mode. For example, an internal impedance of a battery cell may be measured to determine the health of the battery cell. In addition, based on the internal impedance of each battery cell, a load or energy balance amongst the battery cells can be derived. The available battery capacity can also be determined. Based on at least some of the above parameters, a charge time or discharge time of the BBU can be calculated. This is important when a BBU is utilized within an electronic rack of a data center. When the main power is unavailable, the BBU needs to provide power to at least allow the electronic rack to back up its data to a safe storage during the power outage. By determining the health of the BBU, the backup time period that the BBU can support may be determine ahead of the power outage. If it is determined the BBU's health is not sufficient, the data processing task may be offloaded or migrated to another electronic rack for safety reasons before it is too late.

Figure 3:
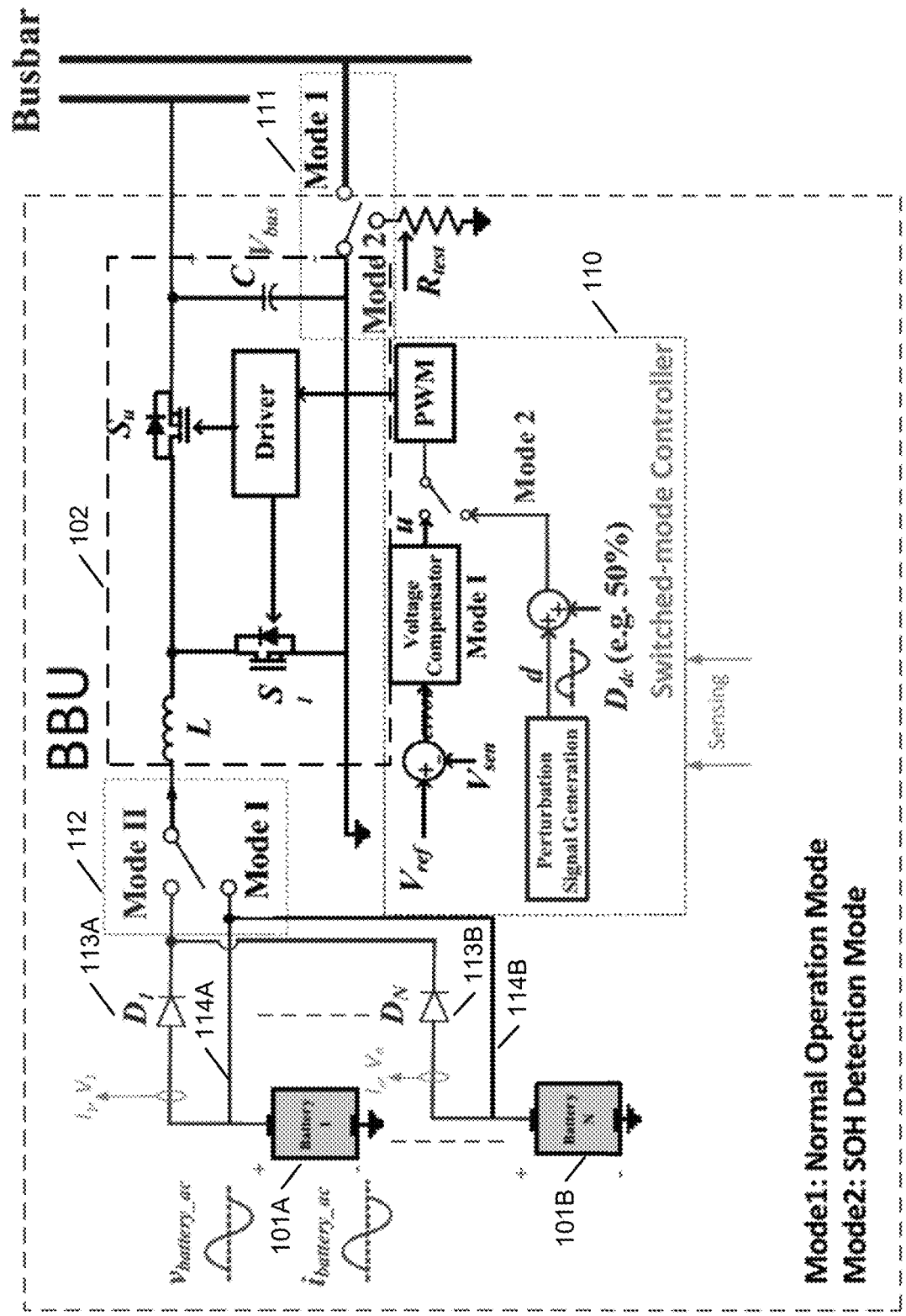
FIG. 3 is a block diagram illustrating an example of a backup battery unit according to another embodiment.

FIG. 3 shows a BBU according to a particular embodiment with a built-in self-inspection mechanism as discussed above. Referring to FIG. 3, each battery cell/module is coupled in parallel at the input of a DC/DC power converter. In order to provide high current to the load/server, multiple BBUs may be coupled in parallel at the Busbar (e.g., the main power rail of an electronic rack). As shown in FIG. 3, there are two control modes in the controller design. Mode I is the normal operation mode to perform the voltage regulation or current regulation for battery charging. Mode II is the health detection mode by measuring the battery AC impedance as the health indicator. For most of the time, BBUs operate in the normal operation mode. The Busbar voltage is sensed to compare with the reference value VBus_ref and the error is sent to the voltage compensator. The output of voltage compensator is the duty cycle of the DC/DC converter.

In control Mode II, the connection is changed from busbar (which is coupled with server) to a test load. As shown in FIG. 3, the duty cycle of the DC/DC converter is obtained by adding a sinusoidal perturbation to it. DC average value is given by Eq. (1) as follows.

$$d(t)=D_{avg}+D_{ptb} \times \sin(2\pi f_{ptb} t) \quad (1)$$

As a result, a small ripple over the DC/average values of the voltage and current of different batteries is generated and given by the following equations.

$$\begin{cases} i_{battery1} = I_{battery\_avg1} + I_{battery\_ptb1} \times \sin(2\pi f_{ptb} t + \theta_{i1}) \\ i_{battery2} = I_{battery\_avg2} + I_{battery\_avg2} \times \sin(2\pi f_{ptb} t + \theta_{i2}) \\ i_{batteryN} = I_{batteryN} + I_{batteryN} \times \sin(2\pi f_{ptb} t + \theta_{iN}) \end{cases}$$

$$\begin{cases} v_{battery1} = V_{battery\_avg1} + V_{battery\_ptb1} \times \sin(2\pi f_{ptb} t + \theta_{v1}) \\ v_{battery2} = V_{battery\_avg2} + V_{battery\_avg2} \times \sin(2\pi f_{ptb} t + \theta_{v2}) \\ v_{batteryN} = V_{batteryN} + V_{batteryN} \times \sin(2\pi f_{ptb} t + \theta_{vN}) \end{cases}$$

where Ibattery_avg and Vbattery_avg are the average values of battery current and voltage; Ibattery_ptb and Vbattery_ptb are the perturbation values of battery current and voltage; fptb is the perturbation frequency; and θnd θare the phase shift of battery current and voltage compared with duty cycle.

By detecting the magnitude and phase of voltage and current perturbation, the impedance of batteries can be calculated based on the following equations.

$$|Z_{battery}(f_{ptb})| = \frac{V_{battery\_ptb}}{I_{battery\_ptb}}$$

$$\angle Z_{battery}(f_{ptb}) = \theta_v - \theta_i$$

The impedance of battery can be used as the indicator to detect the battery health situation.

As described above, a BBU can be utilized as a backup power supply unit in an electronic rack of a data center. An electronic rack includes an array of server blades, each including a computer server for data processing. The electronic rack further includes a power supply to provide power to the server blades and a BBU to provide backup power to the server blades when the power supply is unavailable. The BBU includes components that can operate in a first mode and a second mode as described above. By embedding a self-inspection circuit as a part of the BBU, the health of the BBU can be determined, manually in response to a user input or automatically according to a maintenance schedule, without having to physically remove the BBU from the electronic rack. For example, a user can simply push a button or turn on a switch of an electronic rack to send a signal to a controller (e.g., controller 110) of a BBU, which in turns configure the BBU in the second mode (e.g., health determination mode) and a variety of battery operating parameters can be measured, which can be utilized to determine the SOH or the health of the BBU.

Figure 4:
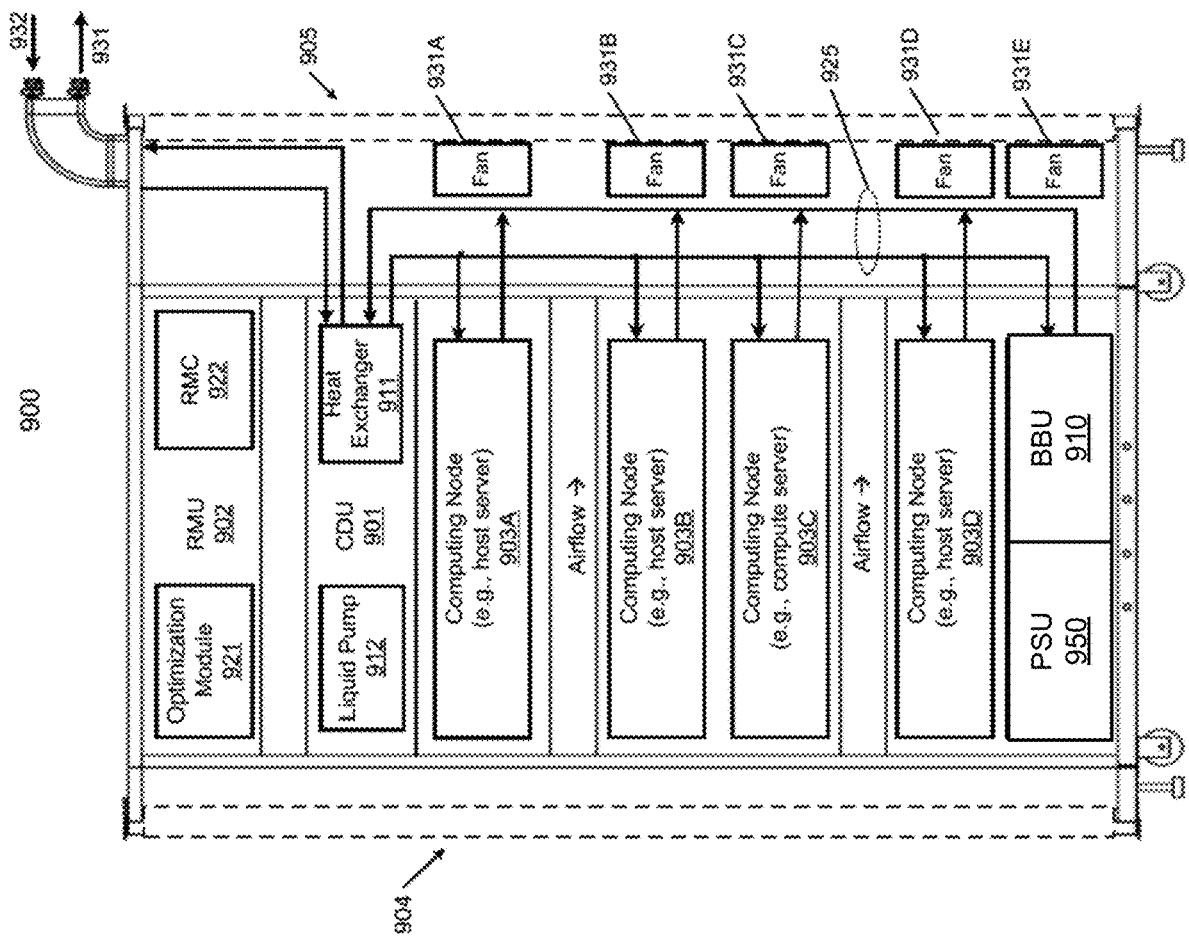
FIG. 4 shows an example of an electronic rack containing a backup battery pack according to one embodiment.

FIG. 4 is a block diagram illustrating an example of an electronic rack according to one embodiment. Electronic rack 900 may include one or more server slots to contain one or more servers respectively. Each server includes one or more information technology (IT) components (e.g., processors, memory, storage devices, network interfaces). Referring to FIG. 4, according to one embodiment, electronic rack 900 includes, but is not limited to, CDU 901, rack management unit (RMU) 902 (optional), a power supply unit (PSU) 950, a BBU 910, and one or more server blades 903A-903D (collectively referred to as server blades 903). Server blades 903 can be inserted into an array of server slots respectively from frontend 904 or backend 905 of electronic rack 900. The PSU 950 and/or BBU 910 may be inserted into any of server slots 903 within the electronic rack 900.

Note that although there are only four server blades 903A-903D shown here, more or fewer server blades may be maintained within electronic rack 900. Also note that the particular positions of CDU 901, RMU 902, PSU 950, BBU 910, and server blades 903 are shown for the purpose of illustration only; other arrangements or configurations of CDU 901, RMU 902, BBU 910, and server blades 903 may also be implemented. Note that electronic rack 900 can be either open to the environment or partially contained by a rack container, as long as the cooling fans can generate airflows from the frontend to the backend.

In addition, a fan module can be associated with each of the server blades 903, and BBU 910. In this embodiment, fan modules 931A-931E, collectively referred to as fan modules 931, and are associated with server blades 903A-903D and BBU 910 respectively. Each of the fan modules 931 includes one or more cooling fans. Fan modules 931 may be mounted on the backends of server blades 903 and BBU 910 to generate airflows flowing from frontend 904, traveling through the air space of the sever blades 903, and existing at backend 905 of electronic rack 900.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or extremal cooling loop. In addition, heat exchanger 911 further includes a second loop with two ports having a second pair of liquid connectors coupled to liquid manifold 925 to form a secondary loop, which may include a supply manifold to supply cooling liquid to server blades 903 and a return manifold to return warmer liquid back to CDU 901. Note that CDUs 901 can be any kind of CDUs commercially available or customized ones. Thus, the details of CDUs 901 will not be described herein. As an example, cooling device 108 shown in FIG. 7 may connect to 925 to complete a full fluid loop.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 900 further includes optional RMU 902 configured to provide and manage power supplied to servers 903, fan modules 931, and CDU 901. Optimization module 921 and RMC 922 can communicate with a controller in some of the applications. RMU 902 may be coupled to power supply unit 950 to manage the power consumption of the power supply unit. The power supply unit 950 may include the necessary circuitry (e.g., an alternating current (AC) to direct current (DC) or DC to DC power converter, backup battery, transformer, or regulator, etc.,) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance are adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds. According to one embodiment, BBU 910 can be implemented as any of the BBUs described above as shown in FIGS. 1-3.

Note that some or all of the IT components of servers 903 may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A backup battery unit (BBU) to provide backup power, the BBU comprising:
   a plurality of battery cells;
   a direct-current to direct-current (DC/DC) converter coupled to the battery cells to generate and regulate an output voltage based on battery energy provided by the battery cells, wherein the battery cells are each coupled in parallel to the DC/DC converter; and
   a first switch logic coupled to the battery cells and the DC/DC converter, wherein the first switch logic is configured to switch the BBU to operate between a first mode and a second mode, wherein when operating in the first mode, the first switch logic causes the output voltage to be provided to an external load, and wherein when operating in the second mode, the first switch logic causes the output voltage to be coupled to an internal load for determining health of the battery cells.

2. The BBU of claim 1, further comprising a second switch logic coupled between the battery cells and the DC/DC converter to switch the battery cells to operate between the first mode and the second mode.

3. The BBU of claim 2, wherein the second switch logic comprises a plurality of switching devices, one for each of the battery cells to couple a corresponding battery cell to the DC/DC converter respectively.

4. The BBU of claim 3, wherein when operating in the first mode, the second switch logic is configured to directly couple the battery cells to the DC/DC converter, and wherein when operating in the second mode, the second switch logic is configured to couple the battery cells to the DC/DC via their respective switching devices.

5. The BBU of claim 4, wherein each of the switching devices is a unidirectional switching device that only allows an electronic current flowing from the corresponding battery cell to the DC/DC converter.

6. The BBU of claim 5, wherein at least one of the switching devices comprises a diode.

7. The BBU of claim 5, wherein each of the switching devices is coupled in series between a positive terminal of the corresponding battery cell to a positive terminal of the DC/DC converter.

8. The BBU of claim 1, wherein the DC/DC converter is a bidirectional DC/DC converter, and wherein the external load represents a computer server of an electronic rack or an external power supply.

9. The BBU of claim 8, wherein when the external load is an external power supply, the external power supply is configured to provide power to charge the battery cells.

10. An electronic rack of a data center, comprising:
a plurality of server blades arranged in a stack, each server blade including one or more servers to provide data processing services;
a power supply coupled to the server blades to provide power to operate the servers; and
a backup battery unit (BBU) coupled to the server blades to provide backup power to the servers when the power supply is unable to provide power, wherein the BBU comprises
a plurality of battery cells,
a direct-current to direct-current (DC/DC) converter coupled to the battery cells to generate and regulate an output voltage based on battery energy provided by the battery cells, wherein the battery cells are each coupled in parallel to the DC/DC converter, and
a first switch logic coupled to the battery cells and the DC/DC converter, wherein the first switch logic is configured to switch the BBU to operate between a first mode and a second mode, wherein when operating in the first mode, the first switch logic causes the output voltage to be provided to an external load, and wherein when operating in the second mode, the first switch logic causes the output voltage to be coupled to an internal load for determining health of the battery cells.

11. The electronic rack of claim 10, wherein the BBU further comprises a second switch logic coupled between the battery cells and the DC/DC converter to switch the battery cells to operate between the first mode and the second mode.

12. The electronic rack of claim 11, wherein the second switch logic comprises a plurality of switching devices, one for each of the battery cells to couple a corresponding battery cell to the DC/DC converter respectively.

13. The electronic rack of claim 12, wherein when operating in the first mode, the second switch logic is configured to directly couple the battery cells to the DC/DC converter, and wherein when operating in the second mode, the second switch logic is configured to couple the battery cells to the DC/DC via their respective switching devices.

14. The electronic rack of claim 13, wherein each of the switching devices is a unidirectional switching device that only allows an electronic current flowing from the corresponding battery cell to the DC/DC converter.

15. The electronic rack of claim 14, wherein at least one of the switching devices comprises a diode.

16. The electronic rack of claim 14, wherein each of the switching devices is coupled in series between a positive terminal of the corresponding battery cell to a positive terminal of the DC/DC converter.

17. The electronic rack of claim 10, wherein the DC/DC converter is a bidirectional DC/DC converter, and wherein the external load represents a computer server of an electronic rack or an external power supply.

18. The electronic rack of claim 17, wherein when the external load is an external power supply, the external power supply is configured to provide power to charge the battery cells.

* * * * *